US006227873B1

(12) United States Patent
Tung

(10) Patent No.: US 6,227,873 B1
(45) Date of Patent: May 8, 2001

(54) IC CARD CONNECTOR APPARATUS

(75) Inventor: Shun-Chi Tung, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/330,515

(22) Filed: Jun. 11, 1999

(30) Foreign Application Priority Data

Dec. 28, 1998 (TW) .............................................. 87221623

(51) Int. Cl.$^{7}$ ...................................................... H05K 1/00

(52) U.S. Cl. ............................................................... 439/79

(58) Field of Search ............................... 439/79, 633, 78, 439/378, 752, 676, 80, 55, 59, 62, 541.5; 361/785, 748, 756

(56) References Cited

U.S. PATENT DOCUMENTS 5,688,130 * 11/1997 Huang .................................. 439/79
5,692,912 * 12/1997 Nelson et al. ........................ 439/79
5,692,913 * 12/1997 Takano et al. ........................ 439/79

* cited by examiner

*Primary Examiner*—Brian Sircus
*Assistant Examiner*—J. F Duverne
(74) *Attorney, Agent, or Firm*—Wei Te Chung

(57) ABSTRACT

An IC card connector apparatus comprises a header connector (40) and a pair of electrical sockets (42) respectively mounted on upper and lower surfaces of a circuit board (44). The header connector includes an insulative housing (46) defining a space (48) for receiving an IC card (50) therein. The housing has a mating face (52) adjacent to the space and a mounting face (54) opposite the mating face. Two arrays of terminals (56) are retained in the housing and extend through the mating face and the mounting face. Each socket includes an insulative housing (62) and a number of contacts (66) connected to the circuit board by surface mount technology. In installation, the terminals of the header connector are inserted into the sockets and mate with the corresponding contacts thereof. Thus, signals can be reliably transmitted between the IC card received in the header connector and the circuit board.

6 Claims, 3 Drawing Sheets

IC CARD CONNECTOR APPARATUS

BACKGROUND OF THE INVENTION

The present invention relates to an IC card connector apparatus, and particularly to an IC card connector apparatus which has a pair of electrical sockets respectively mounted on upper and lower surfaces of a circuit board for connecting the IC card connector apparatus to the circuit board.

Notebook computers are becoming increasingly popular due to their unique advantages. Nowadays almost all notebook computers are provided with an IC card connectors for connecting an IC card to a circuit board. Some mechanisms are adapted to connect the IC connector to the circuit board, such as the disclosures of Taiwan Patent Application Nos. 82210513, 84206175, and 84206176.

Referring to FIG. 1, a conventional IC card connector 10 includes an insulative housing 12 having a front face 14 and a rear face 16 opposite the front face 14, a space 18 adjacent to the rear surface 16 for receiving an IC card (not shown) therein, and two arrays of contacts 20 retained in the housing 12. Each contact 20 forms a mating end 22 and a mounting end 24 opposite the mating end 22. Two arrays of the mating ends 22 of the contacts 20 extend beyond the rear face 16 and into the space 18 for engaging with an IC card, and the mounting ends 24 extend beyond the front face 14 of the housing 12. Each mounting end 24 forms a curved portion which provides the mounting end 24 with resiliency. A circuit board 26 is inserted into a space between the two arrays of mounting ends 24 of the contacts 20. The mounting ends 24 abuts against upper and lower surfaces of the circuit board 26 and electrically contact circuits formed thereon. However, if the IC card connector 10 cannot be securely retained at a predetermined position, signal transmission through the IC card connector 10 will be adversely affected.

FIG. 2 shows an IC card connector 28 which contacts a circuit board 30 by means of a flexible printed circuit 32. One end of the flexible printed circuit 32 engages with contacts 34 of the IC card connector 28, and the other end engages with a connector 36 mounted on the circuit board 30. Since the flexible printed circuit is expensive, such a device cannot be competitively priced.

SUMMARY OF THE INVENTION

Accordingly, a main object of the present invention is to provide an IC card connector apparatus which can reliably connect with a circuit board.

Another object of the present invention is to provide an IC card connector apparatus which can be easily manufactured and maintained.

To fulfill the above-mentioned objects, an IC card connector apparatus of the present invention comprises a header connector and a pair of electrical sockets respectively mounted on upper and lower surfaces of a circuit board edge. The header connector includes an insulative housing defining a space for receiving an IC card therein. The housing has a mating face adjacent to the space and a mounting face opposite the mating face. Two arrays of terminals are retained in the housing and extend through the mating face and the mounting face. Each socket includes an insulative housing and a plurality of contacts. Each contact is soldered to the circuit board by surface mounting technology. In installation, the terminals of the header connector are inserted into the sockets and mate the corresponding contacts thereof. Thus, signals are reliably transmitted between the IC card received in the header connector and the circuit board.

DETAILED DESCRIPTION OF THE INVENTION

Figure 1:
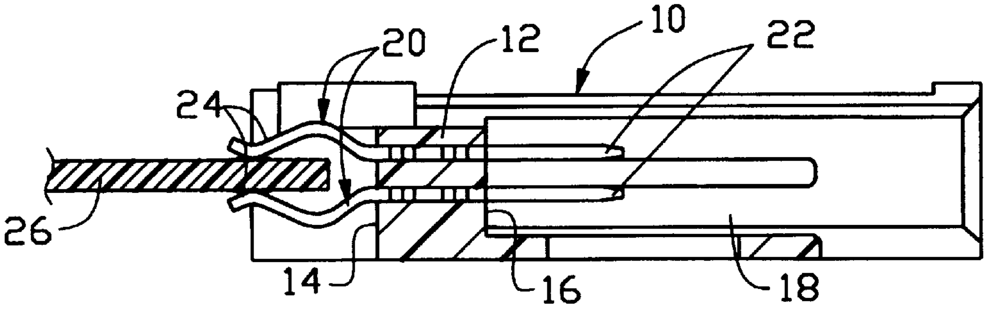
(PRIOR ART) FIG.1
FIG. 1 is a cross sectional view of a conventional IC card connector.
Figure 2:
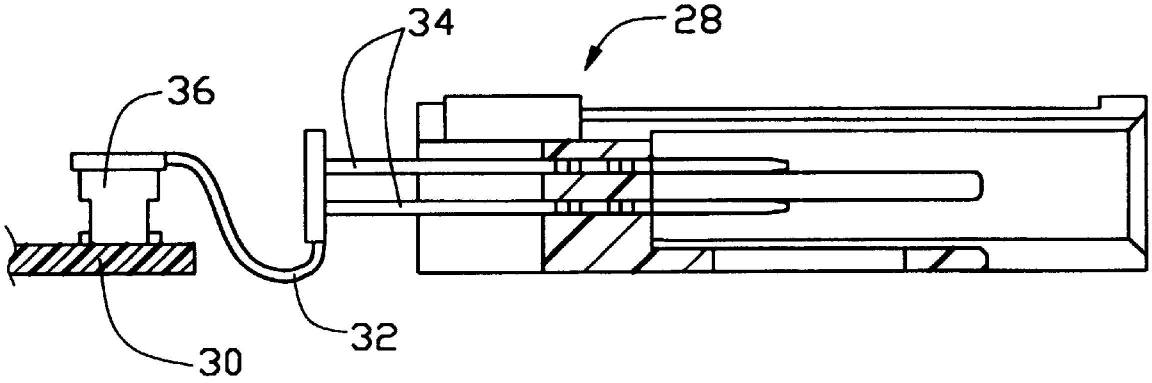
FIG.2 (PRIOR ART)
FIG. 2 is a cross sectional view of another conventional IC card connector.
Figure 3:
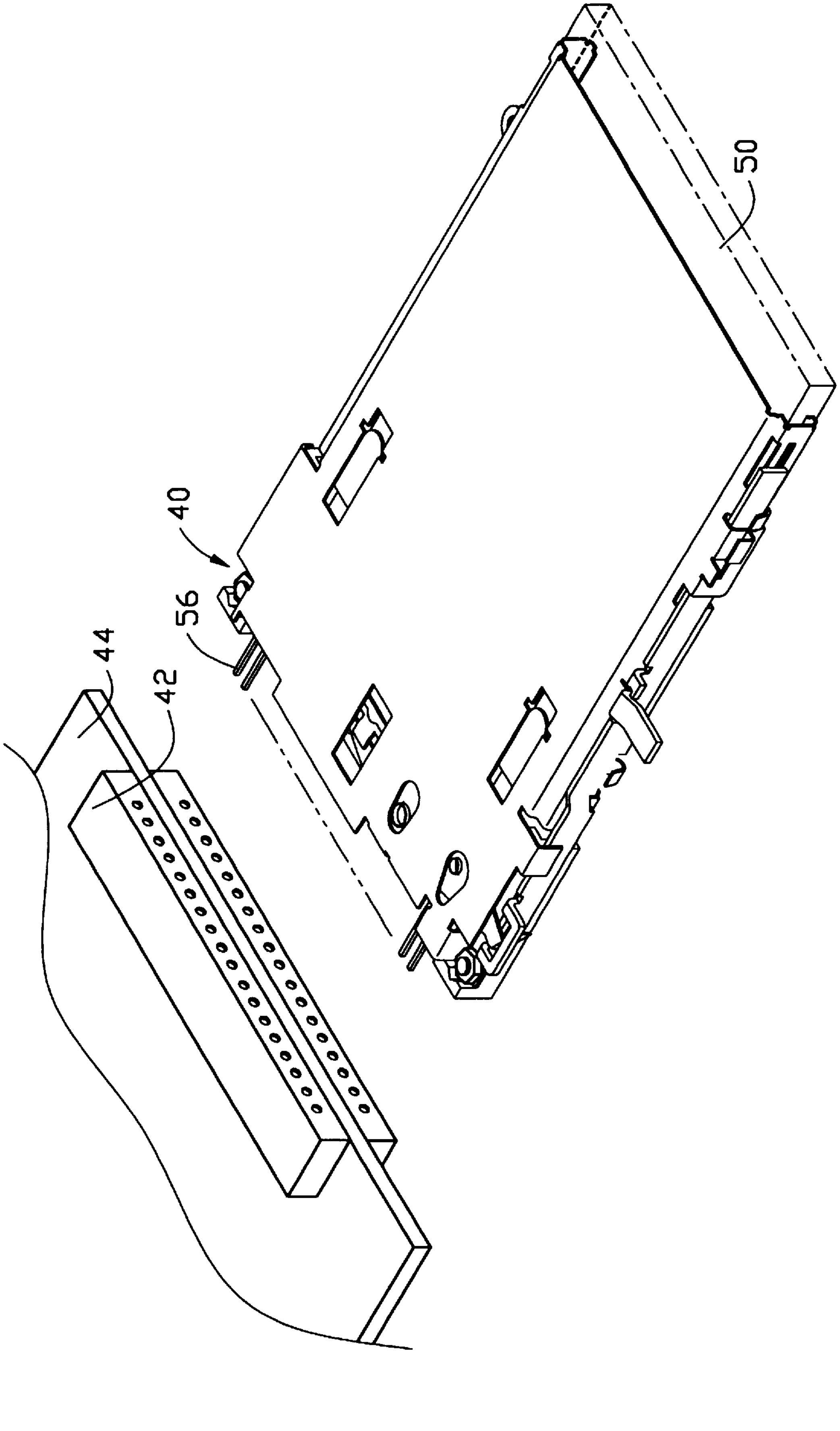
FIG. 3 is a perspective view of an IC card connector apparatus in accordance with the present invention.
Figure 4:
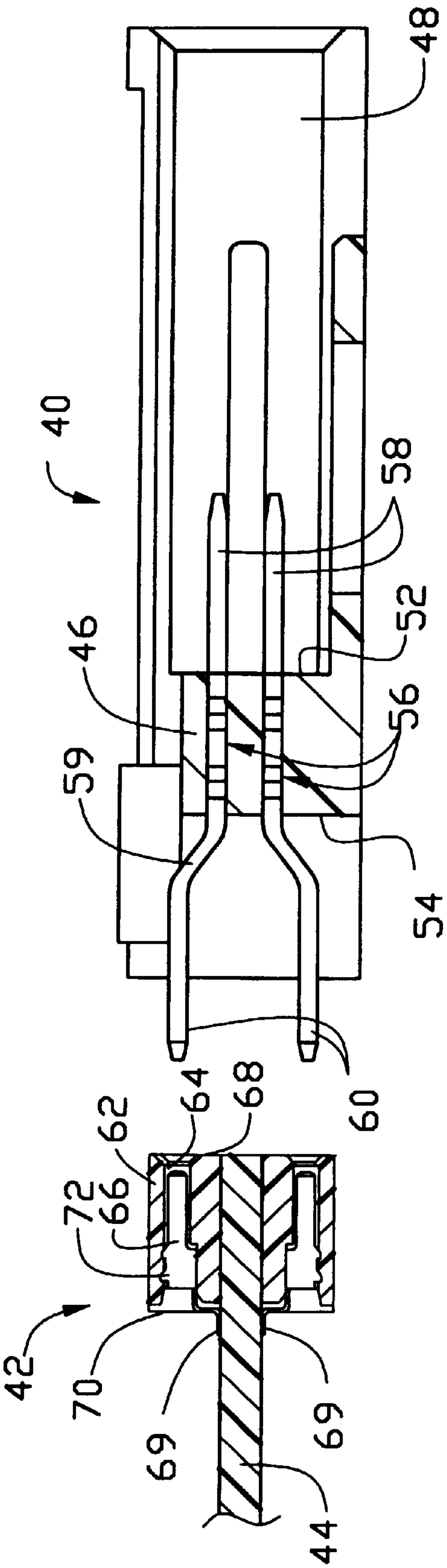
FIG. 4 is a cross sectional view of FIG. 3.

Referring to FIGS. 3 and 4, an IC card connector apparatus includes a header connector 40 and a pair of electrical sockets 42 respectively mounted on upper and lower surfaces proximate an edge of a circuit board 44. The header connector 40 includes an insulative housing 46 and defines a space 48 therein for receiving an IC card 50. The housing 46 has a rear face 52 adjacent to the space 48 and a front face 54 opposite the rear face 52. Two arrays of terminals 56 are retained in the housing 46. Each terminal 56 forms a mating portion 58 extending beyond the rear face 52 and into the space 48 for engaging the IC card 50 and a mounting portion 60 opposite the mating portion 58 and extending beyond the front face 54 of the housing 46. A bent portion 59 extending between the mating portion 58 and the mounting portion 60. Each pair of corresponding bent portions 59 extend away from each other.

Each socket 42 includes an insulative housing 62 defining a plurality of passageways 64 and a corresponding number of contacts 66 retained in the passageways 64. The housing 62 defines a mating face 68 flush with the edge of the circuit board 44 and a mounting face 70 opposite the mating face 68. A mounting portion 69 of each contact 66 extends beyond the mounting face 70 and is soldered to the circuit board 44 by surface mount technology. In addition, each contact 66 forms locking barbs 72 thereon for securely retaining the contact 66 in the corresponding passageway 64.

In installation, the mounting portions 60 of the terminals 56 of the header connector 40 are inserted into the corresponding contacts 66 in the passageways 64 of the housing 62 for mating therebetween. The header connector 40 is electrically connected to the socket 42. It is readily apparent that the connection between the header connector 40 and the socket 42 is reliable. In addition, the sockets 42 mounted on the circuit board 44 are easily manufactured and maintained.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An IC card connector apparatus comprising:

a pair of electrical sockets respectively mounted on upper and lower surfaces of an edge portion of a circuit board, each socket including an insulative housing defining a plurality of passageways and a corresponding number of contacts retained in the passageways; and a header connector including an insulative housing and two arrays of terminals retained in the housing, the terminals being insertable into the passageways of the sockets above and below the circuit board to mate with corresponding contacts in the passageways, thereby securing the header connector to the sockets; wherein the insulative housing of each socket defines a mating face flush with an edge of the circuit board and a mounting face opposite to said mating face, and said circuit board is sandwiched between said pair of sockets.

2. The IC card connector apparatus as claimed in claim 1, wherein one end of each contact of the socket extends beyond the housing and is soldered to the circuit board.

3. The IC card connector apparatus as claimed in claim 1, wherein each contact of the socket forms a locking barb for securely retaining the contact in the corresponding passageway.

4. The IC card connector apparatus as claimed in claim 1, wherein at least one array of terminals each are bent to align with corresponding contacts of the socket.

5. The IC card connector apparatus as claimed in claim 4, wherein each terminal of the header connector forms a bent portion, each pair of corresponding bent portions extending away from each other.

6. An interconnection system comprising:

a header connector including an insulative housing and two arrays of terminals retained therein; and a pair of electrical sockets respectively mounted on upper and lower surfaces of a circuit board around an edge thereof, each of said sockets defining an array of horizontal passageways and a corresponding number of contacts retained therein, respectively; wherein said two arrays of terminals are outward offset from each other around mounting portions thereof, are compliantly received within the corresponding passageways of the pair of sockets and are engaged with the associated contacts therein, respectively, and the terminals, when received within the corresponding passageways, are parallel to the circuit board; wherein the insulative housing of each socket defines a mating face flush with the edge of the circuit board and a mounting face opposite to said mating face, and said circuit board is sandwiched between said pair of sockets.

* * * * *